United States Patent
Kim et al.

(10) Patent No.: US 12,404,215 B2
(45) Date of Patent: Sep. 2, 2025

(54) CERAMIC SUSCEPTOR AND MANUFACTURING METHOD THEREOF

(71) Applicant: KSM COMPONENT CO., LTD., Gimpo-si (KR)

(72) Inventors: Yun Ho Kim, Gimpo-si (KR); Joo Hwan Kim, Gimpo-si (KR); Hwan Young Park, Gimpo-si (KR); Bo Sung Kim, Gimpo-si (KR); Hyun Taek Lee, Gimpo-si (KR)

(73) Assignee: KSM COMPONENT CO., LTD., Gimpo-si (KR)

( * ) Notice: Subject to any disclaimer, the term of this patent is extended or adjusted under 35 U.S.C. 154(b) by 0 days.

(21) Appl. No.: 18/888,637

(22) Filed: Sep. 18, 2024

(65) Prior Publication Data

US 2025/0136515 A1    May 1, 2025

(30) Foreign Application Priority Data

Oct. 25, 2023   (KR) .................. 10-2023-0143623

(51) Int. Cl.
*C04B 35/103*    (2006.01)
*C04B 35/638*    (2006.01)
(Continued)

(52) U.S. Cl.
CPC .......... *C04B 35/103* (2013.01); *C04B 35/638* (2013.01); *C04B 35/64* (2013.01);
(Continued)

(58) Field of Classification Search
CPC .......... C04B 35/103; C04B 2235/3206; C04B 2235/3217; C04B 2235/3225; C04B 2235/3865
See application file for complete search history.

(56) References Cited

U.S. PATENT DOCUMENTS

| 10,020,218 | B2 | 7/2018 | Boyd, Jr. et al. |
| 11,230,502 | B2 | 1/2022 | Yagi et al. |

(Continued)

FOREIGN PATENT DOCUMENTS

| CN | 109761616 A | 5/2019 |
| CN | 1155595562 A | 1/2023 |

(Continued)

OTHER PUBLICATIONS

Yalamaç, Emre, Antonio Trapani, and Sedat Akkurt. "Sintering and microstructural investigation of gamma-alpha alumina powders." Engineering Science and Technology, an International Journal 17.1 (2014): 2-7. (Year: 2014).*

(Continued)

*Primary Examiner* — Amber R Orlando
*Assistant Examiner* — Cameron K Miller
(74) *Attorney, Agent, or Firm* — Sughrue Mion, PLLC

(57) ABSTRACT

A ceramic susceptor particularly with excellent volumetric resistance at high temperatures and thermal conductivity at room temperature compared to a typical ceramic susceptor and a method for manufacturing the same are disclosed. The ceramic susceptor is characterized by comprising alumina ($Al_2O_3$); and aluminum nitride (AlN), and not comprising a secondary phase including an aluminum oxynitride phase (AlON phase).

10 Claims, 2 Drawing Sheets

(51) Int. Cl.
*C04B 35/64* (2006.01)
*H01L 21/687* (2006.01)

(52) U.S. Cl.
CPC .................. *H01L 21/68757* (2013.01); *C04B 2235/3206* (2013.01); *C04B 2235/3217* (2013.01); *C04B 2235/3225* (2013.01); *C04B 2235/3865* (2013.01); *C04B 2235/425* (2013.01); *C04B 2235/602* (2013.01)

(56) References Cited

U.S. PATENT DOCUMENTS

| | | |
|---|---|---|
| 11,251,061 B2 | 2/2022 | Kim et al. |
| 12,154,799 B2 | 11/2024 | Jin |
| 2012/0056807 A1 | 3/2012 | Chapman et al. |
| 2017/0271179 A1 | 9/2017 | Parkhe et al. |
| 2023/0013637 A1 | 1/2023 | Aguilar Santillan et al. |

FOREIGN PATENT DOCUMENTS

| | | |
|---|---|---|
| CN | 18613352 A | 9/2023 |
| JP | 8-67565 A | 3/1996 |
| JP | 2004-22382 A | 1/2004 |
| JP | 2019-167288 A | 10/2019 |
| JP | 2021-521653 A | 8/2021 |
| JP | 2023-47311 A | 4/2023 |
| KR | 10-2017-0141340 A | 12/2017 |
| KR | 10-2554268 B1 | 7/2018 |
| KR | 10-1965895 B1 | 4/2019 |
| KR | 10-1986682 B1 | 6/2019 |
| KR | 10-2023-0009313 A | 1/2023 |
| KR | 10-2518254 B1 | 4/2023 |
| KR | 10-2535856 B1 | 5/2023 |

OTHER PUBLICATIONS

Torrisi, Lorenzo, et al. "Measurements on five characterizing properties of graphene oxide and reduced graphene oxide foils." physica status solidi (a) 219.6 (2022): 2100628. (Year: 2022).*
KR10-2017-0141340 machine translation via Kipris (Year: 2017).*
Korean Notice Regarding Accelerated Examination for KR Application No. 10-2023-0143623, dated Dec. 12, 2023.
Korean Office Action for KR Application No. 10-2023-0143623, dated Jan. 22, 2024.
Korean Office Decision to Grant Patent for KR Application No. 10-2023-0143623, dated Apr. 22, 2024.

* cited by examiner

CERAMIC SUSCEPTOR AND MANUFACTURING METHOD THEREOF

CROSS REFERENCE TO RELATED APPLICATIONS

This application claims priority to and benefits of Korean Patent Application No. 10-2023-0143623 filed Oct. 25, 2023, of which entire content is incorporated by reference.

TECHNICAL FIELD

The present invention relates to a ceramic susceptor and a method of manufacturing the same, and more specifically, to a ceramic susceptor that has particularly excellent volumetric resistance at high temperatures and excellent thermal conductivity at room temperature, as compared to ordinary ceramic susceptors and a method of manufacturing the same.

BACKGROUND ART

As semiconductor processes are becoming more and more micronized and more highly integrated, it is inevitable to use high-output plasma. Accordingly, in the process field for etching semiconductor devices or realizing other ultra-fine shapes, a vacuum plasma equipment using high-temperature plasma is widely used. In addition, such vacuum plasma equipment includes a plasma enhanced chemical vapor deposition (PECVD) equipment, which forms a deposition film on a substrate using a chemical vapor deposition method using plasma, a sputtering equipment to physically form a deposition film, and a dry etching equipment to etch the substrate or material coated on the substrate into a specific pattern, etc.

However, since high-temperature plasma is generated inside vacuum plasma equipment, the chamber and its internal components are likely to be damaged. In addition, there is a high possibility that certain elements and contaminant particles will be generated from the surface of the chamber and the parts provided inside it, thereby contaminating the interior of the chamber. In particular, in the case of plasma etching equipment, since reactive gases such as F and Cl are injected under a plasma atmosphere, the inner wall of the chamber and its internal components are inevitably placed in a very corrosive environment. Generally, this corrosion primarily causes chemical and physical damages to the chamber and the parts provided therein, and secondarily generates contaminants and particles, causing an increase in the defect rate and a decrease in quality of products manufactured through processes inside the chamber.

In addition, if the chamber and the parts provided within it are damaged, since some of the damaged equipment needs to be replaced, cleaned, or repaired, additional costs are incurred, and since the process line must be stopped for this, the process time required to manufacture the product is also increased. For these reasons, metal susceptors installed inside existing chambers are being replaced by ceramic susceptors. Examples of such ceramic susceptors comprise aluminum nitride (AlN) sintered body or alumina ($Al_2O_3$) sintered body with excellent thermal conductivity. In addition, these ceramic susceptors are mainly used in heaters or electrostatic chucks for the semiconductor manufacturing process.

In the case of aluminum nitride, it is stable at high temperatures and has physical properties such as excellent electrical insulating properties and thermal conductivity. Also, since it has a thermal expansion coefficient similar to silicon, it is mainly used in semiconductor manufacturing devices that require high electrical resistance at high temperatures. Alumina is also a material that is stable at high temperatures and has better electrical insulating properties and higher hardness than aluminum nitride.

Meanwhile, recently, semiconductor processes have been developing into micronized processes and larger diameter equipment to improve yield, but various problems occur during the semiconductor manufacturing process due to the micronization of the process and the large diameter of the equipment. Therefore, there is a need for next-generation semiconductor processing technology that can overcome this. Accordingly, the process is carried out in a harsher environment of 600 to 700° C., and in order to withstand this environment, the ceramic susceptor must satisfy the ceramic properties of a volumetric resistance of 1.0E+10 to 1.0E+13 Ω·cm at 500° C. and a thermal conductivity of 30 W/m·k or more, preferably 40 W/m·k or more at room temperature.

However, in the case of aluminum nitride, the volumetric resistance decreases rapidly at 500° C., which tends to cause leakage current, and in the case of aluminum, and in the case of alumina, there is a problem that the thermal conductivity at room temperature is very low, at the level of 20 to 30 W/m·k. If the thermal conductivity at room temperature is only 20 to 30 W/m·k, there are problems that the temperature uniformity deviation is increased and the yield is decreased. In addition, if the temperature uniformity deviation of the thermal conductivity is large, the life time of the product may be shortened due to the thermal stress and thermal shock. Therefore, in order to prevent leakage current even at temperatures of 500° C. or higher, a ceramic susceptor with high volumetric resistance and high thermal conductivity at room temperature is required.

DISCLOSURE

Technical Problem

Therefore, it is an object of the present invention to provide a ceramic susceptor that has particularly excellent volumetric resistance at high temperatures and excellent thermal conductivity at room temperature, as compared to ordinary ceramic susceptors, and a method for manufacturing the same.

Technical Solution

In order to achieve the above objects, the present invention provides a ceramic susceptor which comprises alumina ($Al_2O_3$); and aluminum nitride (AlN); and does not comprise a secondary phase including an aluminum oxynitride phase (AlON phase).

In addition, the present invention provides a ceramic susceptor comprising alumina ($Al_2O_3$); and dopant(dopant), wherein the dopant comprises one or more of magnesium oxides (MgO), yttria ($Y_2O_3$), graphene, and rare earth complex oxides.

In addition, the present invention provides a method of preparing a ceramic susceptor, comprising the steps of a) mixing alumina ($Al_2O_3$), aluminum nitride (AlN), an alcohol compound and a binder; b) drying the mixture to prepare a powder from which the alcohol compound component is removed; c) compressing and molding the dried powder to produce a pre-formed body processed into a certain shape;

d) removing the binder component by degreasing the prepared pre-formed body; and e) sintering and polishing the degreased pre-formed body.

In addition, the present invention provides a method of preparing a ceramic susceptor, comprising the steps of a) mixing alumina ($Al_2O_3$), a dopant, an alcohol compound and a binder; b) drying the mixture to prepare a powder from which the alcohol compound component is removed; c) compressing and molding the dried powder to produce a pre-formed body processed into a certain shape; d) removing the binder component by degreasing the prepared pre-formed body; and e) sintering and polishing the degreased pre-formed body, wherein the dopant comprises one or more of magnesium oxides (MgO), yttria ($Y_2O_3$), graphene, and rare earth complex oxides.

Advantageous Effects

According to the ceramic susceptor and its preparation method according to the present invention, there are particularly excellent advantages in volumetric resistance at high temperatures and thermal conductivity at room temperature, as compared to ordinary ceramic susceptors.

BEST MODE

Figure 1:
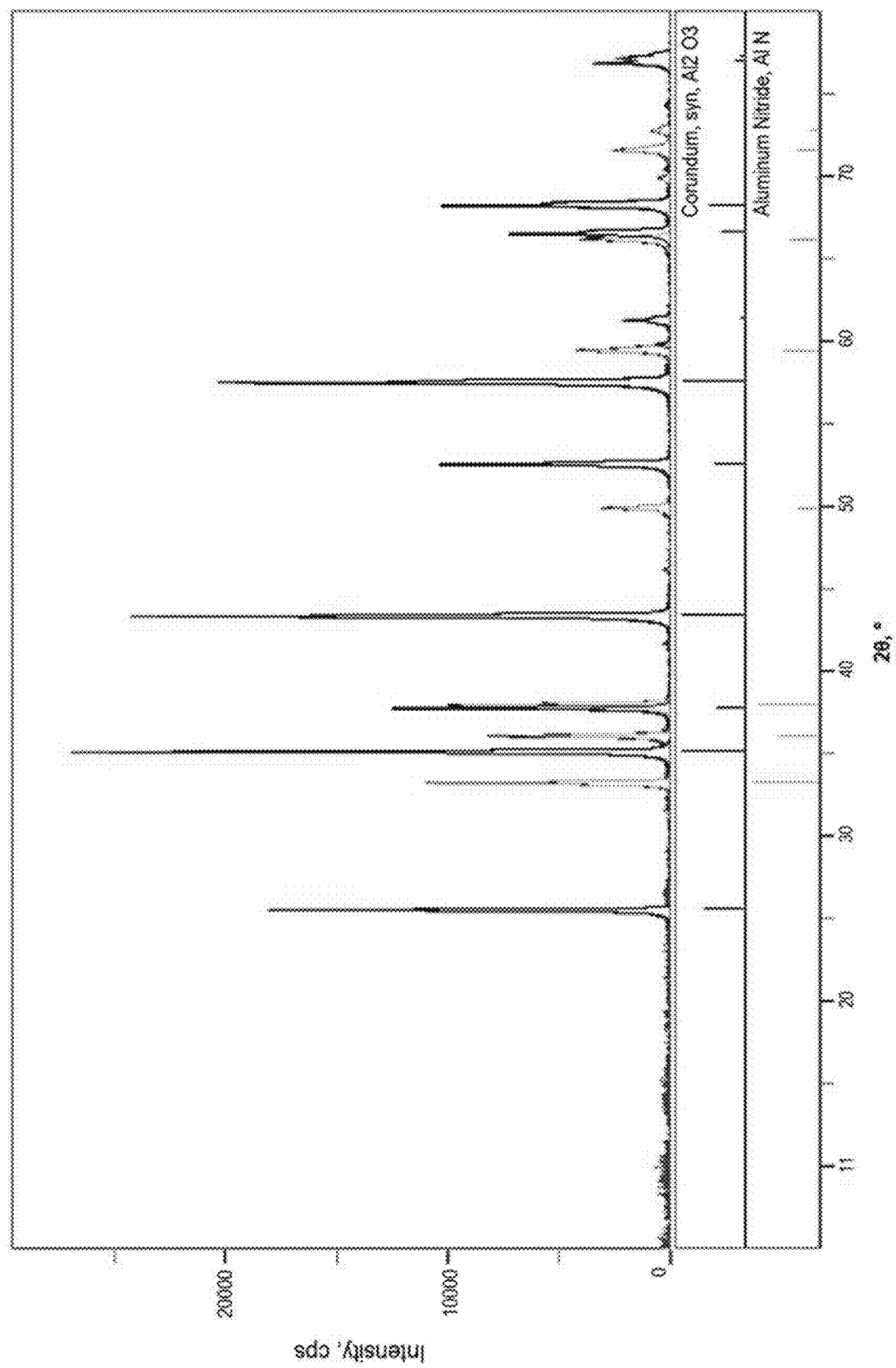
FIG. 1 is an XRD graph showing the physical properties of the ceramic susceptor according to the sintering temperature.

Hereinafter, the present invention will be described in detail.

The ceramic susceptor according to the first embodiment of the present invention is characterized in that it comprises alumina ($Al_2O_3$) and aluminum nitride (AlN) and does not comprise a secondary phase including an aluminum oxynitride phase (AlON phase).

As semiconductor processes are becoming more and more micronized and more highly integrated, it is inevitable to use high-output plasma, and accordingly, for etching semiconductor devices or realizing other ultra-fine shapes, a vacuum plasma equipment using high-temperature plasma is widely used. Accordingly, in the art, in place of the existing metal susceptor, a ceramic susceptor made of aluminum nitride (AlN) sintered body or alumina ($Al_2O_3$) sintered body, which has better plasma corrosion resistance, is used. In particular, recently, in order to refine the process and increase the diameter of the equipment for improving yield in semiconductor processes, the manufacturing process of semiconductors is carried out at 600 to 700° C. which is a harsher environment. In order to withstand this environment, the ceramic susceptor must satisfy the ceramic properties of a volumetric resistance of 1.0E+10 to 1.0E+13 Ω·cm at 500° C. and a thermal conductivity of 30 W/m·k or more, preferably 40 W/m·k or more at room temperature.

However, in the case of aluminum nitride, the volumetric resistance decreases rapidly at 500° C., which tends to cause leakage current, and in the case of alumina, there is a problem that the thermal conductivity at room temperature is very low at the level of 20 to 30 W/m·k. If the thermal conductivity at room temperature is only 20 to 30 W/m·k, there are problems that temperature uniformity deviation is increased and the yield is decreased. Additionally, if the temperature uniformity deviation of thermal conductivity is large, the life time of the product may be shortened due to thermal stress and thermal shock. Accordingly, as a result of various studies, the present applicant has invented a ceramic susceptor that can be used at high temperatures of 500° C. or more, which can prevent leakage current by having high volumetric resistance even at temperatures of 500° C. or more, and solve the above problems because the thermal conductivity at room temperature is also higher than in the normal case.

The ceramic susceptor according to the first embodiment of the present invention is a sintered body comprising alumina ($Al_2O_3$), which not only has excellent electrical insulating property and high hardness, but is also stable at high temperature, and aluminum nitride (AlN), which is stable at high temperature and has physical properties of excellent electrical insulating property and thermal conductivity, and as the main phase.

In particular, the present invention is characterized in that both problems that occur when alumina and aluminum nitride are used separately and problems that occur when alumina and aluminum nitride are not mixed at an optimal ratio are solved by mixing the alumina and aluminum nitride at an optimal ratio. Specifically, if alumina and aluminum nitride are mixed at an optimal ratio as in the present invention, secondary phases such as AlON phase are not generated (i.e., secondary phases including AlON phase are not included), and the alumina phase and aluminum nitride phase are evenly mixed and distributed without any change in the crystal phase, and thus the physical properties of the ceramic susceptor can be maximized, as shown in Table 5, which will be described later. Also, in the process of manufacturing the ceramic susceptor, the creation of secondary phases can be more thoroughly prevented by performing the sintering process at the optimal temperature (temperature less than 1,650° C., preferably more than 1,300° C. and less than 1,650° C.). Accordingly, the ceramic susceptor satisfies the ceramic properties of a volumetric resistance of 1.0E+10 to 1.0E+13 Ω·cm at 500° C. and a thermal conductivity of 30 W/m·k or more at room temperature.

The ceramic susceptor according to the first embodiment of the present invention contains exceeding 68% by weight but less than 99.8% by weight, preferably 70 to 95% by weight, more preferably 70 to 80% by weight, and most preferably 73 to 77% by weight of alumina. In addition, the ceramic susceptor according to the first embodiment of the present invention contains exceeding 0.2% by weight but less than 32% by weight, preferably 5 to 30% by weight, more preferably 20 to 30% by weight, and most preferably 23 to 27% by weight of aluminum nitride. If each of the alumina and aluminum nitride does not satisfy the above content range, the volumetric resistance at 500° C. or thermal conductivity at room temperature does not meet the requirements, and thus the ceramic susceptor does not satisfy the ceramic properties, which require volumetric resistance at 500° C. of 1.0E+10 to 1.0E+13 Ω·cm and thermal conductivity at room temperature of 30 W/m·k or more.

The purity of the alumina and aluminum nitride is preferably 99% or more, their particles are preferably nano-sized, and both are preferably used in the form of powder.

More specifically, the alumina particles may have nanometer sizes to micrometer sizes. For example, the alumina particles may be particles obtained by mixing alumina particles with a size of 3 to 5 μm and alumina particles with a size of 50 nm at a weight ratio of about 7:3 and then pulverizing them through a ball-mill process. However, the particle size and mixing ratio may vary greatly, and the ball mill process may be excluded, so the particle size and mixing ratio are not limited to the above examples.

Additionally, the average particle size (D50) of the aluminum nitride particles may be 0.5 to 1.5 µm, preferably 0.8 to 1.3 µm, and more preferably 0.9 to 1.2 µm. If the average particle size (D50) of the aluminum nitride particles is less than 0.5 µm, the reaction temperature is lowered, which may cause a problem that a secondary phase is created by reacting with alumina at low temperature. In addition, if the average particle size (D50) of the aluminum nitride particles exceeds 1.5 µm, an optimally dense/sufficiently dense structure with alumina is not formed, and thus, a problem may occur in which density is lowered during final sintering. In addition, in the present invention, it is desirable to exclude nanometer-sized aluminum nitride particles as much as possible.

Meanwhile, the ceramic susceptor according to the first embodiment may further comprise a dopant, if necessary. The dopant can be used to further improve the thermal conductivity of the ceramic susceptor.

For example, when applying a normal sintered body to a substrate and using a ceramic heater or electrostatic chuck for semiconductors at a high temperature of 500° C. or higher, there are cases where the substrate is broken by thermal shock because it cannot keep up with the rapid change in temperature of the heating element. However, in order to improve the thermal shock resistance of the substrate, if the dopant is even mixed and applied to a heater or electrostatic chuck, the heat from the heating element can be efficiently transferred and the substrate can be prevented from being broken by thermal shock.

In addition, as the dopant of the present invention, any one or more of magnesium oxide (MgO), yttria ($Y_2O_3$), graphene, and rare earth complex oxides may be exemplified.

If the ceramic susceptor also comprises the dopant, the dopant may be comprised in an amount of 0.05 to 2 parts by weight, preferably 0.1 to 1 parts by weight, and more preferably 0.2 to 0.8 parts by weight, based on the total weight of 100 parts by weight of alumina and aluminum nitride. If the dopant is comprised in an amount of less than 0.05 parts by weight or not comprised at all, based on the total weight of 100 parts by weight of the alumina and aluminum nitride, the same problems that appeared in the prior art appear, or the effect that can be obtained by using dopant is significantly reduced, and thus the degree of improvement in thermal conductivity may not be sufficient, and non-sintering problems may also occur. In addition, if the content of the dopant exceeds 2 parts by weight based on the total weight of 100 parts by weight of the alumina and aluminum nitride, the dispersion effect decreases, and thus rather, there may be a tendency for thermal conductivity to decrease and sintering density to decrease, and also due to the influence of the dopant, there may also be problems that the color of the product may be darken or the color of the corresponding dopant is expressed as is. In addition, all dopants used in the present invention preferably have a purity of 99% or more. In addition, it is preferable that each dopant is comprised in an amount of 0.05 to 0.5% by weight.

Magnesium oxide, which is one of the dopants, may be comprised to improve the thermal conductivity and volumetric resistance of the ceramic susceptor. The magnesium oxide can cause the formation of $MgAl_2O_4$ phase or MgAlON phase through sintering with the alumina and/or aluminum nitride. If the $MgAl_2O_4$ phase or MgAlON phase is generated in excess, because the density can be lowered and thus rather, the thermal conductivity can be lowered, it is necessary to control the content of the ingredients even if the same ingredients are used. For example, in the present invention, at least one of the $MgAl_2O_4$ phase and the MgAlON phase included in the finally manufactured ceramic susceptor may be present in an amount of less than 1% by weight, preferably less than 0.8% by weight, and more preferably 0.6% by weight or less, based on the total weight of the ceramic susceptor. In addition, there is no particular limitation on the particle size of the magnesium oxide, but it is desirable to exclude nanometer-sized particles that may have a relatively weak effect.

The yttria ($Y_2O_3$) may be included to improve the thermal conductivity of the ceramic susceptor. The purity of the yttria is preferably 99% or more, and in terms of improving physical properties through densification, it is better for yttria particles to have a nano size, and it is desirable for yttria to be used in the form of powder. More specifically, the average particle size (D50) of the yttria particles may be 50 to 150 nm, preferably 70 to 120 nm, and more preferably 90 to 100 nm. If the average particle size (D50) of the yttria particles is less than 50 nm, even if it is contained in a trace amount, there is a risk that due to the characteristics of nanoscale yttria powder, problems such as the sintered body taking on the color of yttria particles (yellow, etc.) may occur. In addition, if the average particle size (D50) of the yttria particles exceeds 150 nm, an incomplete sintered body may be formed during sintering, and thus a problem of decreasing the thermal conductivity may occur due to the decrease in density. In particular, if the average particle size (D50) of the yttria particles is at the micrometer level, these problems may become more prominent.

The graphene may also be comprised to improve the thermal conductivity of the ceramic susceptor. The purity of the graphene is preferably 99% or more, graphene particles have a nano size, and such graphene is preferably used in the form of powder (Graphene nano powder, GNP). More specifically, the average particle size (D50) of the graphene particles may be 0.1 to 1.5 nm, preferably 0.3 to 1 nm, and more preferably 0.5 to 0.8 nm. If the average particle size (D50) of the graphene particle is less than 0.1 nm, it may not be large enough to serve as a bridge between graphene particles, and thus the effect of improving the thermal conductivity may be insufficient or absent. In addition, if the average particle size (D50) of the graphene particles exceeds 1.5 nm, the graphene particles may become entangled with each other and may not be dispersed well, and thus a problem of reduction in thermal conductivity due to a decrease in density may occur.

Lastly, the rare earth complex oxides comprise two or more rare-earth metals selected from the group consisting of scandium (Sc), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (YB) and lutetium (Lu). It is desirable that the purity of rare earth complex oxides containing such rare-earth metals is 99% or higher. The shape of the rare earth complex oxides is preferably powder, and there is no particular limitation on the size of the powder particles.

The rare earth complex oxides can further improve the thermal conductivity of the ceramic susceptor, and also the time required for dechucking can be reduced by using the rare earth complex oxides. The rare earth complex oxides contain two or more rare-earth metals as described above, and may preferably contain 2 to 5 different rare-earth metals.

As the rare earth complex oxides containing 2 to 5 different rare-earth metals, complex oxides containing two different rare-earth metals, such as europium-gadolinium complex oxides (EuGdO$_X$), samarium-gadolinium complex oxides (SmGdO$_X$), cerium-europium complex oxides (CeEuO$_X$), samarium-cerium complex oxides (SmCeO$_X$), gadolinium-samarium complex oxides (GdSmO$_X$) and lanthanum-cerium complex oxides (LaCeO$_X$); complex oxides containing three different rare-earth metals, such as samarium-cerium-europium complex oxides (SmCeEuO$_X$), gadolinium-cerium-lanthanum complex oxides (GdCeLaO$_X$) and europium-gadolinium-samarium complex oxides (EuGdSmO$_X$); complex oxides containing four different rare-earth metals, such as samarium-cerium-gadolinium-europium complex oxides (SmCeGdEuO$_X$) and gadolinium-samarium-europium-lanthanum complex oxides (GdSmEuLaO$_X$); and complex oxides containing five different rare-earth metals, such as samarium-cerium-europium-gadolinium-lanthanum complex oxides (SmCeEuGdLaO$_X$) may be exemplified, and in addition, it can be used without particular limitations as long as it contains 2 to 5 different rare-earth metals (oxides).

The rare earth complex oxides containing the 2 to 5 different rare-earth metals may contain various different types of rare-earth metals in various mixing ratios. For example, rare earth complex oxides containing 2 to 5 different rare-earth metals may contain two types of rare-earth metals (oxides) in a weight ratio of 2.5 to 3.5:1, three types of rare-earth metals (oxides) in a weight ratio of 1 to 3.5:0.5 to 2.5:1, four types of rare-earth metals (oxides) in a weight ratio of 1.5 to 3.5:0.5 to 2.5:1 to 2.5:1, or five types of rare-earth metals (oxides) in a weight ratio of 1 to 3:0.5 to 1.5:0.5 to 1.5:1 to 2:1, so that rare-earth metals (oxides) can be appropriately mixed to maximize the intended effect of rare earth complex oxides. For example, SmCeEuO$_X$ may have a weight ratio of each rare-earth metal (oxide) of 2:1:1, GdCeLaO$_X$ may have a weight ratio of each rare-earth metal (oxide) of 3:2:1, EuGdSmO$_X$ may have a weight ratio of each rare-earth metal (oxide) of 1.5:1.5:1, SmCeGdEuO$_X$ may have a weight ratio of each rare-earth metal (oxide) of 2:1:1.5:1, GdSmEuLaO$_X$ may have a weight ratio of each rare-earth metal (oxide) of 3:2:2:1, and SmCeEuGdLaO$_X$ may have a weight ratio of each rare-earth metal (oxide) of 2:1:1:1.5:1.

In the rare earth complex oxides, any one rare-earth metal may be solid-dissolved in the other (or any one) rare-earth metal oxide. Through this, the crystals of rare-earth metal oxides change, and thus, rare earth complex oxides may have increased oxygen lattice defects compared to single rare-earth metal oxide. In this way, rare earth complex oxides with increased oxygen lattice defects have improved interfacial reactivity, and thus can effectively react with the interface or lattice oxygen of the components within the ceramic susceptor.

In addition, as rare-earth metal oxides containing one rare-earth metal, scandium oxide (Sc$_2$O$_3$), lanthanum oxide (La$_2$O$_3$), cerium oxide (CeO$_2$), praseodymium oxide (Pr$_6$O$_{11}$), neodymium oxide (Nd$_2$O$_3$), promethium oxide (Pm$_2$O$_3$), samarium oxide (Sm$_2$O$_3$), europium oxide (Eu$_2$O$_3$), gadolinium oxide (Gd$_2$O$_3$), terbium oxide (Tb$_4$O$_7$), dysprosium oxide (Dy$_2$O$_3$), holmium oxide (Ho$_2$O$_3$), erbium oxide (Er$_2$O$_3$), thulium oxide (Tm$_2$O$_3$), ytterbium oxide (YB$_2$O$_3$) and lutetium oxide (Lu$_2$O$_3$) may be exemplified, but the present invention does not comprise rare-earth metal oxides that contain only one rare-earth metal as a dopant.

Meanwhile, previously, the dopant was described as containing one or more of magnesium oxide, yttria, graphene, and the remaining rare-earth metal oxides excluding yttria. However, it is better for the present invention to basically include magnesium oxide as a dopant. Also, it is preferable to use magnesium oxide and graphene together as a dopant. Also, it is more preferable to use magnesium oxide, graphene, and yttria together as a dopant. Also, it is most preferable to use magnesium oxide, graphene, yttria, and rare earth complex oxides together as a dopant.

If magnesium oxide and graphene are used together as a dopant, the magnesium oxide may be comprised in an amount of 0.05 to 0.5 parts by weight, and the graphene may be comprised in an amount of 0.05 to 0.5 parts by weight, based on the total weight of 100 parts by weight of the alumina and aluminum nitride.

In addition, if magnesium oxide, graphene, and yttria are used together as a dopant, the magnesium oxide may be comprised in an amount of 0.05 to 0.5 parts by weight, the graphene may be comprised in an amount of 0.05 to 0.5 parts by weight, and the yttria may be comprised in an amount of 0.05 to 0.5 parts by weight, based on the total weight of 100 parts by weight of the alumina and aluminum nitride.

In addition, if magnesium oxide, graphene, yttria and rare earth complex oxides are used together as a dopant, the magnesium oxide may be comprised in an amount of 0.05 to 0.5 parts by weight, the graphene may be comprised in an amount of 0.05 to 0.5 parts by weight, the yttria may be comprised in an amount of 0.05 to 0.5 parts by weight, and the rare earth complex oxides may be comprised in an amount of 0.05 to 0.5 parts by weight, based on the total weight of 100 parts by weight of the alumina and aluminum nitride.

Next, a ceramic susceptor according to a second embodiment of the present invention will be described. The ceramic susceptor according to the second embodiment of the present invention includes alumina (Al$_2$O$_3$) and a dopant, and the dopant comprises any one or more of magnesium oxide (MgO), yttria (Y$_2$O$_3$), graphene, and rare earth complex oxides.

The present applicant confirmed that, in addition to the ceramic susceptor according to the first embodiment described above, the ceramic susceptor according to the second embodiment also has excellent volumetric resistance and thermal conductivity. Hereinafter, the ceramic susceptor according to the second embodiment will be described in detail.

The ceramic susceptor according to the second embodiment has a configuration in which only aluminum nitride is excluded from the ceramic susceptor of the first embodiment comprising even a dopant. Here, the alumina is comprised as the remaining amount excluding the total content of the dopant. Specifically, the dopant may be comprised in an amount of 0.05 to 2% by weight, preferably 1 to 2% by weight, and more preferably 1.5 to 2% by weight, based on the total weight of the ceramic susceptor. In addition, the alumina may be comprised in an amount of 98 to 99.95% by weight, preferably 98 to 99% by weight, and more preferably 98 to 98.5% by weight, based on the total weight of the ceramic susceptor. If the alumina and dopant are not comprised in the above content range, the volumetric resistance property and thermal conductivity property targeted by the present invention do not appear.

In addition, it is preferable that all the dopants here have a purity of 99% or higher. In addition, it is preferable that each dopant is preferably comprised in an amount of 0.05 to 0.5% by weight. Meanwhile, if the ceramic susceptor according to the second embodiment comprises magnesium oxide (MgO) as a dopant, the sintering reaction of alumina and magnesium oxide can cause the formation of $MgAl_2O_4$ spinel phase. If the $MgAl_2O_4$ spinel phase is generated in excess, the thermal conductivity may be decreased, and thus, it is necessary to control the content of the components even if the same components are used.

Meanwhile, previously, the dopant was described as containing one or more of magnesium oxide, yttria, graphene, and the remaining rare-earth metal oxides excluding yttria. However, like the first embodiment, it is preferable that the ceramic susceptor according to the second embodiment also basically comprises magnesium oxide as a dopant. Also, it is preferable to use magnesium oxide and graphene together as a dopant. Also, it is more preferable to use magnesium oxide, graphene, and yttria together as a dopant. Also, it is most preferable to use magnesium oxide, graphene, yttria, and rare earth complex oxides together as a dopant.

If magnesium oxide and graphene are used together as a dopant, the magnesium oxide may be comprised in an amount of 0.05 to 0.5% by weight, and the graphene may be comprised in an amount of 0.05 to 0.5% by weight.

In addition, if magnesium oxide, yttria, and graphene are used together as a dopant, the magnesium oxide may be comprised in an amount of 0.05 to 0.5% by weight, the yttria may be comprised in an amount of 0.05 to 0.5% by weight and the graphene may be comprised in an amount of 0.05 to 0.5% by weight.

In particular, if magnesium oxide, yttria, graphene, and rare earth complex oxides are used together as a dopant, the magnesium oxide may be comprised in an amount of 0.05 to 0.5% by weight, the yttria may be comprised in an amount of 0.05 to 0.5% by weight, the graphene may be comprised in an amount of 0.05 to 0.5% by weight, and the rare earth complex oxides may be comprised in an amount of 0.05 to 0.5% by weight.

The ceramic susceptor according to the present invention as described above is characterized in that the volumetric resistance at 500° C. is 1.0E+10 to 1.0E+13 Ω·cm, and the thermal conductivity at room temperature is 30 W/m·k or more, preferably 40 to 60 W/m·k. In other words, the objects of the present invention can be achieved only when the ceramic heater simultaneously satisfies both the volumetric resistance at 500° C. and the thermal conductivity at room temperature.

If the above volumetric resistance rate is not satisfied, it is difficult to apply the ceramic susceptor to the next-generation semiconductor manufacturing process, and even if applied, there may be a problem that the leakage current is rapidly increased. In addition, if the above thermal conductivity is not satisfied, there may be a problem that the temperature uniformity deviation is increased and the yield is decreased, thereby resulting in a shortened life time of product due to thermal stress and thermal shock.

Next, the manufacturing method of the ceramic susceptor according to the present invention will be described.

First, the method of manufacturing the ceramic susceptor according to the first embodiment comprises the steps of a) mixing alumina ($Al_2O_3$), aluminum nitride (AlN), an alcohol compound and a binder, b) drying the mixture to prepare a powder from which the alcohol compound component is removed, c) compressing and molding the dried powder to produce a pre-formed body processed into a certain shape, d) removing the binder component by degreasing the prepared pre-formed body and e) sintering and polishing the degreased pre-formed body.

In addition, if necessary, a dopant can also be added and mixed in the step a), and as such a dopant, one or more of magnesium oxide (MgO), yttria ($Y_2O_3$), graphene, and rare earth complex oxides may be exemplified.

The alcohol compound used in the step a) is used to properly mix the raw materials, and may comprise, for example, alcohol compounds having 1 to 5 carbon atoms, specifically ethanol, methanol, and isopropyl alcohol. Likewise, the binder used in the step a) is to improve the bonding strength of the raw materials, and may comprise, for example, polyvinyl alcohol (PVA) and polyvinyl butyral (PVB).

The step b) is a step of drying the powder mixture mixed in the step a) to remove the alcohol component. The drying can be performed by methods known in the art, such as spray drying and vacuum drying, and the drying time can be variously applied depending on the physical properties of the intended ceramic susceptor.

The step c) is a step of compressing and molding the dried powder to produce a pre-formed body processed into a certain shape. The compression molding is the first molding process to control the powder dried in the step b) into the desired size and shape, and the press molding, etc. may be exemplified. At this time, in order to manufacture products with more dense specifications, cold isostatic pressing (CIP) can be additionally performed as needed. The press molding is preferably performed at room temperature and in a general atmosphere, but is not limited thereto, and the atmosphere during molding is good as long as it does not affect the molding of the mixture. In addition, after the molding process in the step c) is performed, a pre-formed body can be manufactured by performing processing using a green processing (performed before sintering, also called raw processing) method, etc.

The step d) is a step of removing the binder component by degreasing the prepared pre-formed body. The degreasing is a process for removing binders and contaminants with oily properties, and can be performed at a temperature of 350 to 600° C. within 60 hours.

The step e) is a step of manufacturing a ceramic substrate by sintering (second molding) and polishing the degreased pre-formed body. The sintering is a second molding process to further improve the volumetric resistance rate of the ceramic susceptor, and it is preferable to use a hot press sintering method. In addition, if the degreased pre-formed body is sintered at a temperature of 1,650° C. or higher, alumina and aluminum nitride react to form an AlON phase, which causes the problem of lowering the thermal conductivity. Therefore, the sintering in the step e) must be performed at a temperature less than 1,650° C., preferably 1,300° C. or more and less than 1,650° C.

In addition, the method of manufacturing the ceramic susceptor according to the second embodiment comprises the steps of a) mixing alumina ($Al_2O_3$), a dopant, an alcohol compound and a binder, b) drying the mixture to prepare a powder from which the alcohol compound component is removed, c) compressing and molding the dried powder to produce a pre-formed body processed into a certain shape, d) removing the binder component by degreasing the prepared pre-formed body and e) sintering and polishing the degreased pre-formed body, wherein the dopant comprises one or more of magnesium oxide (MgO), yttria ($Y_2O_3$), graphene, and rare earth complex oxides.

The ceramic susceptor of the present invention manufactured through the above manufacturing method can be applied to various devices or members for the semiconductor manufacturing process, and among them, it is preferable to apply it as a material for heaters or electrostatic chucks for the semiconductor manufacturing process. However, there are no particular restrictions on its field of application, such as it can be used in fields that use ceramic materials in a high-temperature plasma environment.

Hereinafter, the present invention will be described in more detail through specific examples. The following examples are intended to illustrate the present invention, and the present invention is not limited by the following examples.

Examples 1 to 8, Comparative Examples 1 to 8

Manufacturing of Ceramic Susceptor

The raw materials were mixed according to the composition in Table 1 below, and additionally, a small amount of ethanol and polyvinyl butyral (binder) were added and then dried. Subsequently, the dried mixture was press molded and processed to prepare a pre-formed body. Then, after degreasing at a temperature of 500° C. for 30 hours, the degreased pre-formed body was sintered in a high-temperature pressurized sintering furnace (pressure of 250 bar, temperature of 1,630° C.) and polished to manufacture a ceramic susceptor.

TABLE 1

| | $Al_2O_3$:AlN (Weight ratio) | Dopant | | | |
|---|---|---|---|---|---|
| | | MgO | GNP (Graphene nano powder) | Nano $Y_2O_3$ | Rare earth complex oxide |
| Example 1 | 100:0 | 0.05 | | | |
| Example 2 | 100:0 | 0.5 | | | |
| Example 3 | 100:0 | 0.5 | 0.05 | | |
| Example 4 | 100:0 | 0.5 | 0.5 | | |
| Example 5 | 100:0 | 0.5 | 0.5 | 0.05 | |
| Example 6 | 100:0 | 0.5 | 0.5 | 0.5 | |
| Example 7 | 100:0 | 0.5 | 0.5 | 0.5 | 0.05 |
| Example 8 | 100:0 | 0.5 | 0.5 | 0.5 | 0.5 |
| Comparative Example 1 | 100:0 | 0.01 | | | |
| Comparative Example 2 | 100:0 | 1 | | | |
| Comparative Example 3 | 100:0 | 0.5 | 0.01 | | |
| Comparative Example 4 | 100:0 | 0.5 | 1 | | |
| Comparative Example 5 | 100:0 | 0.5 | 0.5 | 0.01 | |
| Comparative Example 6 | 100:0 | 0.5 | 0.5 | 1 | |
| Comparative Example 7 | 100:0 | 0.5 | 0.5 | 0.5 | 0.01 |
| Comparative Example 8 | 100:0 | 0.5 | 0.5 | 0.5 | 1 |

* dopant unit: % by weight
* rare earth complex oxide: Ceria-doped Samarium (CDS)

TABLE 2

| | Volumetric resistance rate (@ 500° C., $\Omega \cdot cm$) | Thermal conductivity (@ room temperature, W/m · k) | Density (g/cm³) | Hardness (Gpa) |
|---|---|---|---|---|
| Example 1 | 1.1E+13 | 30.5 | 3.941 | 17.1 |
| Example 2 | 9.8E+12 | 31.2 | 3.944 | 16.9 |
| Example 3 | 7.0E+12 | 31.8 | 3.929 | 16.8 |
| Example 4 | 2.2E+12 | 33.1 | 3.918 | 16.7 |
| Example 5 | 2.4E+12 | 35.0 | 3.915 | 17.1 |
| Example 6 | 3.8E+12 | 36.2 | 3.931 | 17.0 |
| Example 7 | 5.8E+12 | 41.1 | 3.942 | 17.3 |
| Example 8 | 5.1E+12 | 42.7 | 3.951 | 17.1 |
| Comparative Example 1 | 8.8E+12 | 22.7 | 3.938 | 17.3 |
| Comparative Example 2 | 2.3E+13 | 20.8 | 3.935 | 17.4 |
| Comparative Example 3 | 9.4E+12 | 23.6 | 3.940 | 17.0 |
| Comparative Example 4 | 3.7E+11 | 21.6 | 3.842 | 15.8 |
| Comparative Example 5 | 2.5E+12 | 30.1 | 3.922 | 16.8 |
| Comparative Example 6 | 4.0E+12 | 28.7 | 3.933 | 17.2 |
| Comparative Example 7 | 4.0E+12 | 35.8 | 3.940 | 17.2 |
| Comparative Example 8 | 9.7E+11 | 36.5 | 3.948 | 17.2 |

As a result of measuring the volumetric resistance and thermal conductivity of each ceramic susceptor manufac-

[Experiment Example 1] Evaluation of Volumetric Resistance and Thermal Conductivity of Ceramic Susceptor (1)

A voltage of 500 V/mm was applied to each ceramic susceptor manufactured from Examples 1 to 8 and Comparative Examples 1 to 8, and then after 1 minute, the current was measured (measured in a vacuum atmosphere and at room temperature) to calculate the volumetric resistance rate, and the results are shown in Table 2 below.

In addition, specimens were manufactured for each ceramic susceptor manufactured from Examples 1 to 8 and Comparative Examples 1 to 8 using the LFA 467 equipment from NETZSCH in accordance with the specifications of ASTM C0408-88R11, and then the thermal conductivity was calculated by measuring at room temperature, and the results are also shown in Table 2 below.

In addition, the density value of each ceramic susceptor manufactured from Examples 1 to 8 and Comparative Examples 1 to 8 was calculated using the Archimedes method, and the results are also shown in Table 2 below.

tured in Examples 1 to 8 and Comparative Examples 1 to 8, all ceramic susceptors of Examples 1 to 8 satisfied the volumetric resistance (1.0E+10 $\Omega$·cm to 1.0E+13 $\Omega$·cm) at 500° C. required by the next-generation semiconductor manufacturing process, as shown in Table 2 above.

Also, in the case of the thermal conductivity, as can be seen by comparing Examples 1 and 2 with Comparative Examples 1 and 2, Examples 3 and 4 with Comparative Examples 3 and 4, Examples 5 and 6 with Comparative Examples 5 and 6, and Examples 7 and 8 with Comparative Examples 7 and 8, Examples 1 to 8, in which each dopant was used in an amount of 0.05 to 0.5% by weight, were superior to Comparative Examples 1 to 8 in which at least one dopant was used outside the range of 0.05 to 0.5% by weight.

In particular, in Examples 7 and 8, where all dopants were used in amounts of 0.05 to 0.5% by weight, the thermal conductivity at room temperature exceeded 40 W/m·k.

In addition, comparing Example 2 with Comparative Example 2, Example 2 used MgO in an amount of 0.5% by weight, and Comparative Example 2 used MgO in an amount of 1% by weight, and thus although the difference in content was not significant, the thermal conductivity is rapidly decreased while the MgO content increased from 0.5% by weight to 1% by weight. This is due to the fact that if the amount of MgO used exceeds 0.5% by weight, the $MgAl_2O_4$ phase or MgAlON phase is generated in an excess amount exceeding 0.6% by weight in the final product, thereby increasing the fraction. These results can be confirmed through Table 3 below.

TABLE 3

| | $Al_2O_3$:AlN (weight ratio) | Dopant MgO | XRD result (% by weight) | | |
|---|---|---|---|---|---|
| | | | $Al_2O_3$ | AlN | $MgAl_2O_4$ or MgAlON |
| Example 1 | 100:0 | 0.05 | 100 | 0 | 0 |
| Example 2 | 100:0 | 0.5 | 99.4 | 0 | 0.6 |
| Comparative Example 1 | 100:0 | 0.01 | 100 | 0 | 0 |
| Comparative Example 2 | 100:0 | 1 | 98.9 | 0 | 1.1 |

* dopant unit: % by weight

[Manufacturing Examples 1 to 7] Manufacturing of Ceramic Susceptor and Evaluation of Physical Properties For the purpose of deriving the optimal mixing ratio of alumina and aluminum nitride, a ceramic susceptor containing only alumina and aluminum nitride was manufactured in the same ratios as shown in Table 4 below (except for the composition, it was the same as the manufacturing method in Example 1 above).

In addition, the volumetric resistance rate and thermal conductivity were measured for each manufactured ceramic susceptor, and the results are shown in Table 5 below (experiment conditions, etc. are the same as Experiment Example 1).

TABLE 4

| | $Al_2O_3$:AlN (weight ratio) |
|---|---|
| Manufacturing Example 1 | 100:0 |
| Manufacturing Example 2 | 99.8:0.2 |
| Manufacturing Example 3 | 95:5 |
| Manufacturing Example 4 | 85:15 |
| Manufacturing Example 5 | 75:25 |
| Manufacturing Example 6 | 68:32 |
| Manufacturing Example 7 | 60:40 |

TABLE 5

| | Volumetric resistance rate (@ 500° C., $\Omega \cdot cm$) | Thermal conductivity (@ room temperature, W/m · k) | Density (g/cm³) | Hardness (Gpa) | XRD result (% by weight) | |
|---|---|---|---|---|---|---|
| | | | | | $Al_2O_3$ | AlN |
| Manufacturing Example 1 | 1.6E+13 | 23.2 | 3.957 | 17.2 | 100 | 0 |
| Manufacturing Example 2 | 1.1E+13 | 28.4 | 3.959 | 17.1 | 99.5 | 0.5 |
| Manufacturing Example 3 | 3.3E+11 | 31.7 | 3.896 | 16.5 | 94.7 | 5.3 |
| Manufacturing Example 4 | 8.8E+10 | 33.2 | 3.801 | 15.1 | 83.8 | 16.2 |
| Manufacturing Example 5 | 3.0E+10 | 35.1 | 3.755 | 14.7 | 76.1 | 23.9 |
| Manufacturing Example 6 | 9.8E+09 | 36.3 | 3.696 | 14.2 | 67.1 | 32.9 |
| Manufacturing Example 7 | 5.3E+08 | 42.1 | 3.625 | 13.6 | 59.7 | 40.3 |

* $Al_2O_3$ and AlN unit: % by weight

As can be seen from Tables 4 and 5 above, the ratio of aluminum nitride is changed depending on the addition ratio of aluminum nitride, and thus, the volumetric resistance at high temperature and the thermal conductivity at room temperature are changed.

More specifically, the change in physical properties according to the addition ratio of aluminum nitride was confirmed, and as can be seen from the XRD results, the AlON phase was not generated in all of the final products of Manufacturing Examples 1 to 7. In addition, Manufacturing Examples 3 to 5 showed satisfactory results in both the volumetric resistance rate and the thermal conductivity, and Manufacturing Example 5, in which alumina and aluminum nitride were mixed at a weight ratio of 75:25, was the best overall.

Through this, if the content of aluminum nitride is too small, the $Al_2O_3$ phase is formed as the main phase, so there is little effect of improving thermal conductivity, and if the content of aluminum nitride is excessive, the ratio of the AlN phase is increased, and thus there is an effect of improving thermal conductivity, but the volumetric resistance and the hardness tend to decrease.

[Manufacturing Examples 5-1 to 5-5] Evaluation of Physical Properties of Ceramic Susceptor Depending on Sintering Temperature Based on the results showing that Manufacturing Example 5, in which alumina and aluminum nitride were mixed at a weight ratio of 75:25, was the best overall, ceramic susceptors were manufactured while only setting the sintering temperature differently, as shown in Table 6 below (same as the manufacturing method in Example 1 above, except for composition and sintering temperature).

In addition, the volumetric resistance rate and thermal conductivity were measured for each manufactured ceramic susceptor, and the results are shown in Table 7 below (experiment conditions, etc. are the same as Experiment Example 1).

TABLE 6

| | $Al_2O_3$:AlN (weight ratio) | Sintering temperature (° C.) |
|---|---|---|
| Manufacturing Example 5-1 | 75:25 | 1,500 |
| Manufacturing Example 5-2 | 75:25 | 1,550 |
| Manufacturing Example 5-3 | 75:25 | 1,630 |
| Manufacturing Example 5-4 | 75:25 | 1,650 |
| Manufacturing Example 5-5 | 75:25 | 1,700 |

TABLE 7

| | volumetric resistance rate (@ 500° C., $\Omega \cdot cm$) | Thermal conductivity (@ room temperature, W/m · k) | Density (g/cm³) | Hardness (Gpa) | XRD result (% by weight) | | |
|---|---|---|---|---|---|---|---|
| | | | | | $Al_2O_3$ | AlN | AlON |
| Manufacturing Example 5-1 | not measurable | 18.1 | 3.423 | 13.2 | 74.8 | 25.2 | 0 |
| Manufacturing Example 5-2 | 9.9E+09 | 32.2 | 3.718 | 14.4 | 75.4 | 24.6 | 0 |
| Manufacturing Example 5-3 | 3.0E+10 | 35.1 | 3.755 | 14.7 | 76.1 | 23.9 | 0 |
| Manufacturing Example 5-4 | 4.4E+11 | 24.8 | 3.765 | 15.1 | 71.1 | 23.8 | 5.1 |
| Manufacturing Example 5-5 | 6.2E+11 | 19.4 | 3.775 | 16.5 | 58.2 | 17.3 | 24.5 |

* $Al_2O_3$, AlN and AlON unit: % by weight

Figure 2:
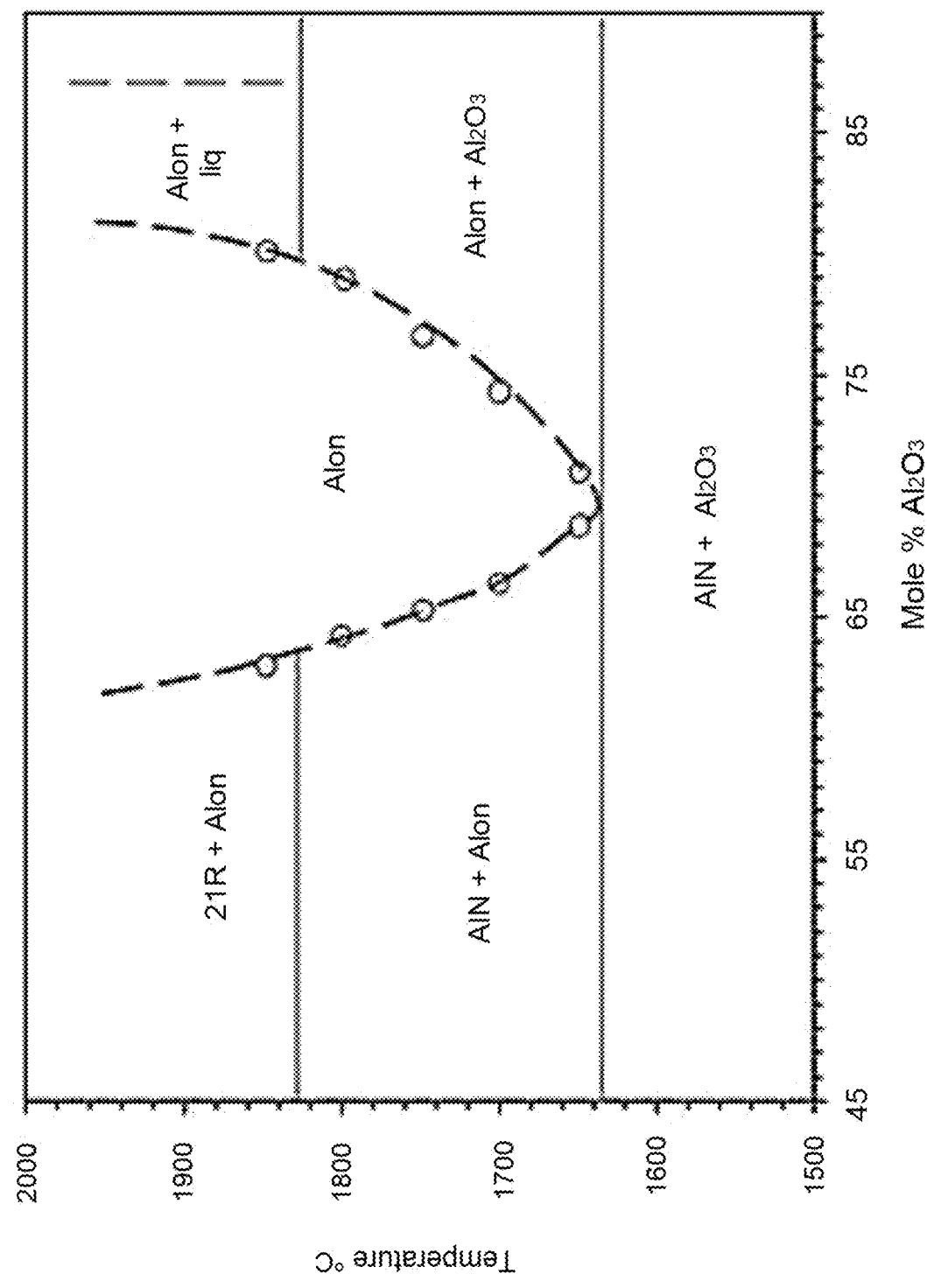
FIG. 2 is a graph showing the correlation between the alumina content and the sintering temperature.

Alumina reacts with aluminum nitride above a certain temperature to form AlON phase. Although the AlON phase has high electrical insulating properties, since its thermal conductivity is low, the presence or absence of the AlON phase has a significant impact on the physical properties. FIG. 1 is an XRD graph showing the physical properties of the ceramic susceptor depending on the sintering temperature, and FIG. 2 is a graph showing the correlation between the alumina content and the sintering temperature. Referring to FIGS. 1 and 2 and Table 1 above, at a sintering temperature of 1,500° C., non-sintering occurred, making the measurement of the volumetric resistance impossible, and the thermal conductivity and density were measured to be very low. As a result of the analysis of the XRD graph, the AlON phase was generated above the sintering temperature of 1,650° C., and as the AlON content is increased, the volumetric resistance is increased, but the thermal conductivity tended to decrease rapidly. Therefore, it can be seen that it is preferable that the sintering in the present invention is performed at a temperature of less than 1,650° C.

Examples 9 to 20, Comparative Example 9 to 20

Manufacturing of Ceramic Susceptor

Considering the experimental result of Manufacturing Example 5-3, the raw materials were mixed according to the composition in Table 8 below, and a small amount of ethanol and polyvinyl butyral (binder) were additionally mixed and then dried. Subsequently, the dried mixture was press molded and processed to prepare a pre-formed body. Then, after degreasing at a temperature of 500° C. for 30 hours, the degreased pre-formed body was sintered in a high-temperature pressurized sintering furnace (pressure of 250 bar, temperature of 1,630° C.) and polished to manufacture a ceramic susceptor.

TABLE 8

| | $Al_2O_3$:AlN (weight ratio) | Dopant | | | |
|---|---|---|---|---|---|
| | | MgO | GNP (Graphene nano powder) | Nano $Y_2O_3$ | Rare earth complex oxide |
| Example 9 | 75:25 | 0.05 | | | |
| Example 10 | 75:25 | 0.1 | | | |
| Example 11 | 75:25 | 0.5 | | | |
| Example 12 | 75:25 | 0.1 | 0.05 | | |
| Example 13 | 75:25 | 0.1 | 0.1 | | |
| Example 14 | 75:25 | 0.1 | 0.5 | | |
| Example 15 | 75:25 | 0.1 | 0.1 | 0.05 | |
| Example 16 | 75:25 | 0.1 | 0.1 | 0.1 | |
| Example 17 | 75:25 | 0.1 | 0.1 | 0.5 | |
| Example 18 | 75:25 | 0.1 | 0.1 | 0.1 | 0.05 |
| Example 19 | 75:25 | 0.1 | 0.1 | 0.1 | 0.1 |
| Example 20 | 75:25 | 0.1 | 0.1 | 0.1 | 0.5 |
| Comparative Example 9 | 75:25 | 0.01 | | | |
| Comparative Example 10 | 75:25 | 1 | | | |
| Comparative Example 11 | 75:25 | 3 | | | |
| Comparative Example 12 | 75:25 | 0.1 | 0.01 | | |

TABLE 8-continued

| | Dopant | | | |
|---|---|---|---|---|
| | $Al_2O_3$:AlN (weight ratio) | MgO | GNP (Graphene nano powder) | Nano $Y_2O_3$ | Rare earth complex oxide |
| Comparative Example 13 | 75:25 | 0.1 | 1 | | |
| Comparative Example 14 | 75:25 | 0.1 | 3 | | |
| Comparative Example 15 | 75:25 | 0.1 | 0.1 | 0.01 | |
| Comparative Example 16 | 75:25 | 0.1 | 0.1 | 1 | |
| Comparative Example 17 | 75:25 | 0.1 | 0.1 | 3 | |
| Comparative Example 18 | 75:25 | 0.1 | 0.1 | 0.1 | 0.01 |
| Comparative Example 19 | 75:25 | 0.1 | 0.1 | 0.1 | 1 |
| Comparative Example 20 | 75:25 | 0.1 | 0.1 | 0.1 | 3 |

* dopant unit: % by weight

[Experiment Example 2] Evaluation of Volumetric Resistance and Thermal Conductivity of Ceramic Susceptor (2)

A voltage of 500 V/mm was applied to each ceramic susceptor manufactured from Examples 9 to 20 and Comparative Examples 9 to 20, and then after 1 minute, the current was measured (measured in a vacuum atmosphere and at room temperature) to calculate the volumetric resistance rate, and the results are shown in Table 9 below.

In addition, specimens were manufactured for each ceramic susceptor manufactured from Examples 9 to 20 and Comparative Examples 9 to 20 using the LFA 467 equipment by NETZSCH company in accordance with the specifications of ASTM C0408-88R11, and then the thermal conductivity was calculated by measuring at room temperature, and the results are also shown in Table 9 below.

In addition, the density value of each ceramic susceptor manufactured from Examples 9 to 20 and Comparative Examples 9 to 20 was calculated using the Archimedes method, and the results are also shown in Table 9 below.

TABLE 9

| | Volumetric resistance rate (@ 500° C., $\Omega \cdot cm$) | Thermal conductivity (@ room temperature, W/m · k) | Density (g/cm³) | Hardness (Gpa) |
|---|---|---|---|---|
| Example 9 | 4.0E+10 | 36.9 | 3.755 | 15.4 |
| Example 10 | 5.1E+10 | 37.1 | 3.751 | 15.2 |
| Example 11 | 8.3E+10 | 37.3 | 3.757 | 15.8 |
| Example 12 | 4.9E+10 | 40.2 | 3.750 | 15.4 |
| Example 13 | 4.4E+10 | 41.8 | 3.742 | 15.3 |
| Example 14 | 4.3E+10 | 42.6 | 3.707 | 15.1 |
| Example 15 | 4.5E+10 | 43.0 | 3.745 | 16.1 |
| Example 16 | 7.0E+10 | 44.4 | 3.742 | 16.3 |
| Example 17 | 8.1E+10 | 49.1 | 3.756 | 16.9 |
| Example 18 | 7.1E+10 | 45.3 | 3.751 | 16.5 |
| Example 19 | 9.5E+10 | 50.7 | 3.767 | 16.8 |
| Example 20 | 7.4E+10 | 50.2 | 3.774 | 16.5 |
| Comparative Example 9 | 3.2E+10 | 36.2 | 3.752 | 15.1 |
| Comparative Example 10 | 1.2E+11 | 24.1 | 3.761 | 16.3 |
| Comparative Example 11 | 2.7E+11 | 17.7 | 3.788 | 15.9 |
| Comparative Example 12 | 5.3E+10 | 37.2 | 3.748 | 15.3 |
| Comparative Example 13 | 2.9E+08 | 24.2 | 3.608 | 13.8 |
| Comparative Example 14 | 1.7E+07 | 18.4 | 3.489 | 11.2 |
| Comparative Example 15 | 1.4E+10 | 38.8 | 3.733 | 15.7 |
| Comparative Example 16 | 6.2E+09 | 37.0 | 3.764 | 17.2 |
| Comparative Example 17 | 8.8E+07 | 28.5 | 3.761 | 16.8 |
| Comparative Example 18 | 6.2E+10 | 39.1 | 3.732 | 16.3 |
| Comparative Example 19 | 2.8E+09 | 37.1 | 3.781 | 17.1 |
| Comparative Example 20 | 7.2E+07 | 22.9 | 3.795 | 17.1 |

As a result of measuring the volumetric resistance rate and thermal conductivity of each ceramic susceptor manufactured in Examples 9 to 20 and Comparative Examples 9 to 20, all ceramic susceptors of Examples 9 to 20 satisfied the volumetric resistance (1.0E+10 $\Omega \cdot cm$ to 1.0E+13 $\Omega \cdot cm$) at 500° C. required by the next-generation semiconductor manufacturing process, as shown in Table 9 above.

Also, in the case of the thermal conductivity, as can be seen by comparing Examples 9 to 11 with Comparative Examples 9 to 11, Examples 12 to 14 with Comparative Examples 12 to 14, Examples 15 to 17 with Comparative Examples 15 to 17, and Examples 18 to 20 with Comparative Examples 18 to 20, Examples 9 to 20, in which each dopant was used in an amount of 0.05 to 0.5% by weight, were superior to Comparative Examples 9 to 20 in which at least one dopant was used outside the range of 0.05 to 0.5% by weight.

Meanwhile, when GNP (graphene nano-powder) was added in addition to MgO as a dopant, the effect was not significant when GNP was used at less than 0.05% by weight, and the thermal conductivity was improved when used in an amount of 0.05 to 0.5% by weight. In addition, when GNP was used in an amount exceeding 0.5% by weight, the volumetric resistance, the density, and the hardness tended to rapidly decrease.

In addition, even when nano-sized yttria ($Y_2O_3$) was added in addition to MgO and GNP as a dopant, when used in an amount of 0.05 to 0.5% by weight, sintering properties were increased, and thus the effect of increasing the volumetric resistance and thermal conductivity was shown. However, when yttria was used in an amount exceeding 0.5% by weight, secondary phases such as YAP, YAM, and YAG were formed in large quantities due to reaction with alumina, and the thermal conductivity tended to decrease.

In addition, even when rare earth complex oxides were added in addition to MgO, GNP and nano-sized yttria ($Y_2O_3$) as a dopant, when used in an amount of 0.05 to 0.5% by weight, it was confirmed that not only did the volumetric resistance and thermal conductivity tend to increase, but the density and hardness were also increased. On the other hand, when rare earth complex oxides were used in amounts exceeding 0.5% by weight, both the volumetric resistance and thermal conductivity tended to decrease rapidly.

In addition, comparing Example 11 with Comparative Example 10, Example 11 used MgO in an amount of 0.5% by weight, and Comparative Example 10 used MgO in an amount of 1% by weight, and thus although the difference in content was not significant, the thermal conductivity is rapidly decreased while the MgO content increased from 0.5% by weight to 1% by weight. This is due to the fact that if the amount of MgO used exceeds 0.5% by weight, the $MgAl_2O_4$ phase or MgAlON phase is generated in an excess amount exceeding 0.6% by weight in the final product, thereby increasing the fraction. These results can be confirmed through Table 10 below.

TABLE 10

|  | $Al_2O_3$:AlN | | XRD result (% by weight) | | |
| --- | --- | --- | --- | --- | --- |
|  | (weight ratio) | Dopant MgO | $Al_2O_3$ | AlN | $MgAl_2O_4$ or MgAlON |
| Example 9 | 75:25 | 0.05 | 75.1 | 24.9 | 0 |
| Example 10 | 75:25 | 0.1 | 75.0 | 24.8 | 0.2 |
| Example 11 | 75:25 | 0.5 | 74.8 | 24.6 | 0.6 |
| Comparative Example 9 | 75:25 | 0.01 | 74.8 | 25.2 | 0 |
| Comparative Example 10 | 75:25 | 1 | 74.6 | 24.1 | 1.3 |
| Comparative Example 11 | 75:25 | 3 | 73.4 | 23.8 | 2.8 |

* dopant unit: % by weight

The invention claimed is:

1. A ceramic susceptor which comprises alumina ($Al_2O_3$); and
   aluminum nitride (AlN), and which does not comprise a secondary phase including an aluminum oxynitride phase (AlON phase),
   wherein a content of the alumina is in excess of 68% by weight and less than 95% by weight, and a content of the aluminum nitride is in excess of 5% by weight and less than 32% by weight,
   wherein the ceramic susceptor has a volumetric resistance rate of 1.0E+10 to 1.0E+13 Ω·cm at 500° C. and a thermal conductivity of 30 to 60 W/m·k or more at room temperature, and
   wherein the ceramic susceptor further comprises yttria ($Y_2O_3$) in an amount of 0.05 to 0.5 parts by weight, based on a total weight of 100 parts by weight of the alumina and the aluminum nitride.

2. The ceramic susceptor according to claim 1, wherein the ceramic susceptor further comprises any one or more dopant of magnesium oxide (MgO), graphene, and a rare earth complex oxide.

3. The ceramic susceptor according to claim 2, wherein the dopant is contained in an amount of 0.05 to 2 parts by weight, based on the total weight of 100 parts by weight of the alumina and the aluminum nitride.

4. The ceramic susceptor according to claim 2, wherein the dopant comprises magnesium oxide and graphene; and wherein the magnesium oxide is comprised in an amount of 0.05 to 0.5 parts by weight, and the graphene is comprised in an amount of 0.05 to 0.5 parts by weight, based on the total weight of 100 parts by weight of the alumina and the aluminum nitride.

5. The ceramic susceptor according to claim 2, wherein the dopant comprises magnesium oxide and graphene; and wherein the magnesium oxide is comprised in an amount of 0.05 to 0.5 parts by weight, and the graphene is comprised in an amount of 0.05 to 0.5 parts by weight, based on the total weight of 100 parts by weight of the alumina and the aluminum nitride.

6. The ceramic susceptor according to claim 2, wherein the dopant comprises magnesium oxide, graphene and rare earth complex oxide; and wherein the magnesium oxide is comprised in an amount of 0.05 to 0.5 parts by weight, the graphene is comprised in an amount of 0.05 to 0.5 parts by weight, and the rare earth complex oxide is comprised in an amount of 0.05 to 0.5 parts by weight, based on the total weight of 100 parts by weight of the alumina and the aluminum nitride.

7. The ceramic susceptor according to claim 2, wherein the ceramic susceptor has a volumetric resistance rate of 1.0E+10 to 1.0E+13 Ω·cm at 500° C. and a thermal conductivity of 40 to 60 W/m·k at room temperature.

8. A method for manufacturing the ceramic susceptor of claim 1, comprising the steps of,
   a) preparing a mixture by mixing alumina, aluminum nitride, yttria, an alcohol compound and a binder;
   b) drying the mixture to prepare a dried powder from which the alcohol compound component is removed;
   c) compressing and molding the dried powder to prepare a pre-formed body processed into a certain shape;
   d) removing the binder by degreasing the prepared pre-formed body; and
   e) sintering and polishing the degreased pre-formed body.

9. The method for manufacturing the ceramic susceptor according to claim 8, wherein the sintering in the step e) is performed at less than 1,650° C.

10. The method for manufacturing the ceramic susceptor according to claim 8, which comprises further adding and mixing at least one dopant of magnesium oxide, graphene, and a rare earth complex oxide in the step a).

* * * * *